United States Patent
Yui

(10) Patent No.: US 9,696,401 B2
(45) Date of Patent: Jul. 4, 2017

(54) MAGNETIC RESONANCE IMAGING APPARATUS AND CONTROLLING METHOD THEREOF

(75) Inventor: Masao Yui, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 2064 days.

(21) Appl. No.: 12/854,426

(22) Filed: Aug. 11, 2010

(65) Prior Publication Data

US 2011/0038520 A1 Feb. 17, 2011

(30) Foreign Application Priority Data

Aug. 11, 2009 (JP) ................. 2009-186764

(51) Int. Cl.
*G06K 9/00* (2006.01)
*G01R 33/567* (2006.01)
*G01R 33/483* (2006.01)

(52) U.S. Cl.
CPC ...... *G01R 33/5676* (2013.01); *G01R 33/4835* (2013.01)

(58) Field of Classification Search
CPC .............. G01R 33/5676; G01R 33/4835
USPC .......................... 382/131; 324/309
See application file for complete search history.

(56) References Cited

U.S. PATENT DOCUMENTS

| 7,365,543 B2 | 4/2008 | Yui et al. |
| 2008/0231271 A1 | 9/2008 | Yui et al. |
| 2008/0240536 A1* | 10/2008 | Soubelet ............ A61B 6/12 382/132 |
| 2008/0310698 A1* | 12/2008 | Boeing ............ A61B 6/032 382/131 |
| 2009/0148021 A1 | 6/2009 | Yui |

OTHER PUBLICATIONS

Klessen, C., MD et al.; "Magnetic Resonance Imaging of the Upper Abdomen Using a Free-Breathing T2-Weighted Turbo Spin Echo Sequence with Navigator Triggered Prospective Acquisition Correction", Journal of Magnetic Resonance Imaging, vol. 21, (2005), pp. 576-582.

* cited by examiner

*Primary Examiner* — Elaine Gort
*Assistant Examiner* — Rajiv Raj
(74) *Attorney, Agent, or Firm* — Nixon & Vanderhye P.C.

(57) ABSTRACT

In a magnetic resonance imaging system, MRI data acquisition sequences are repeatedly and alternately executed for (a) a diagnostic image and (b) a navigator image that is an image for motion detection. Each subsequent navigator image is analyzed to detect the position of a mark indicating the position of a slice excited by the prior execution of a diagnostic imaging sequence. The respiratory motion of a portion of the subject is estimated based on the detected position of the mark.

11 Claims, 11 Drawing Sheets

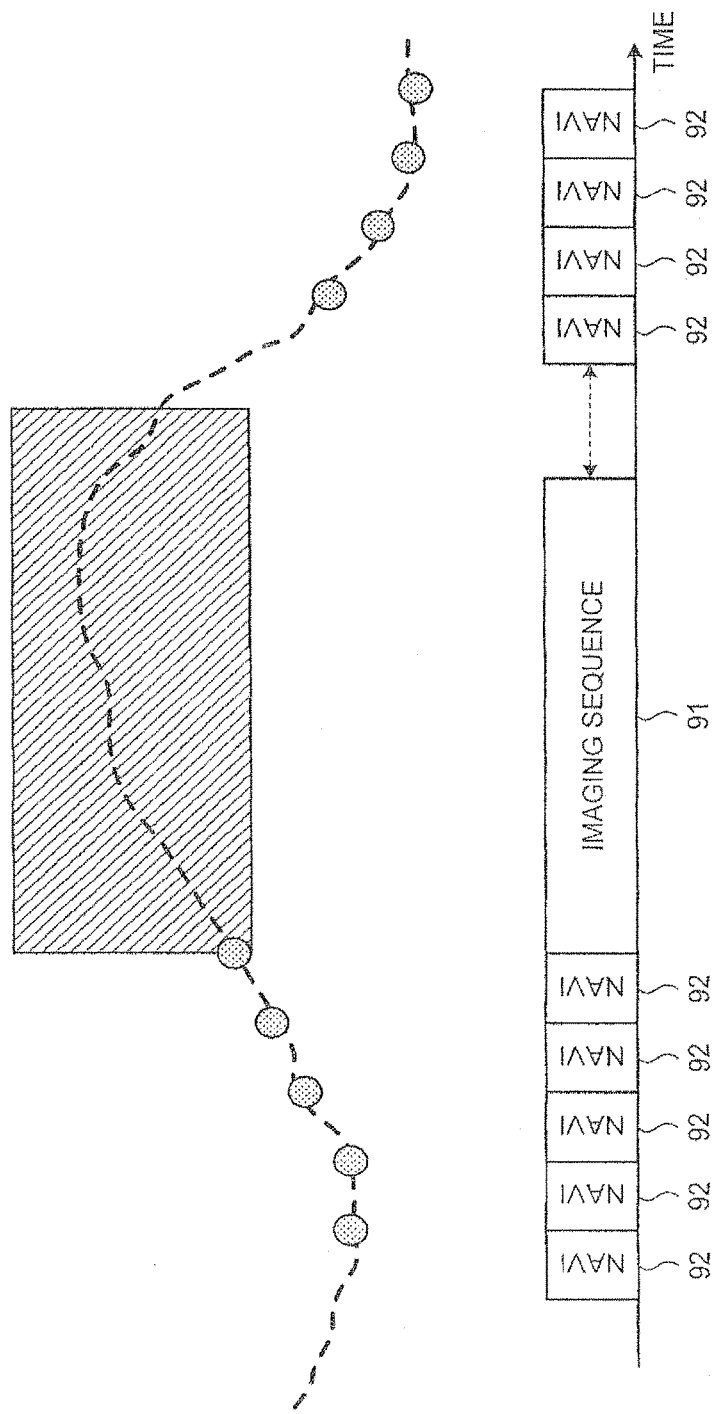

MAGNETIC RESONANCE IMAGING APPARATUS AND CONTROLLING METHOD THEREOF

CROSS-REFERENCE TO RELATED APPLICATIONS

This application is based upon and claims the benefit of priority from Japanese Patent Application No. 2009-186764, filed on Aug. 11, 2009; the entire contents of which are incorporated herein by reference.

FIELD

Embodiments described herein relate generally to a magnetic resonance imaging apparatus and a method of controlling the apparatus.

BACKGROUND

A magnetic resonance imaging apparatus creates images of a subject's internal body by use of magnetic resonance phenomenon. Specifically, the magnetic resonance imaging apparatus applies a high frequency magnetic field to the subject positioned in a magnetostatic field, and detects a nuclear magnetic resonance (NMR) signal output from the subject in response to the application. Then, the magnetic resonance imaging apparatus reconstructs images from the detected NMR signal.

Conventionally, when an image of an abdomen or the like is to be taken by use of the magnetic resonance imaging apparatus, imaging is conducted by having the subject hold its breath or by synchronizing the imaging with breathing. The breath-holding imaging method is performed while the subject patient is holding its breath for about 10 seconds. The breath-synchronizing imaging method is performed by putting gear such as bellows on the patient and monitoring the patient's respiration state so that imaging can be synchronized with breathing.

Both the breath-holding imaging and the respiration-synchronizing imaging are targeted at reduction of artifacts that tend to be created in an image due to respiration. In the breath-holding imaging, however, drawbacks have been pointed out that the spatial resolution is substantially limited by the length of breath-holding time and that the method is not suitable for a patient who cannot hold its breath. Furthermore, in the respiration-synchronizing imaging, drawbacks have been pointed out that it is difficult to obtain stability in the sensitivity of the gear and that the data collecting timing is limited to the stable respiratory phase and therefore the entire imaging time becomes longer.

Recently, a respiration-synchronizing imaging method with which the diaphragm in respiration is monitored by use of NMR signals has been introduced (see, for example, Klessen et al., "Magnetic Resonance Imaging of the Upper Abdomen Using a Free-breathing T2-weighted Turbo Spin Echo Sequence with Navigator Triggered Prospective Acquisition Correction", Journal of Magnetic Resonance Imaging 21, 2005, pp. 576 to 582).

FIGS. 12A, 12B, and 13 are diagrams for explaining the conventional respiration-synchronizing imaging method adopting NMR signals. As indicated in FIG. 12A, with the conventional method, the magnetic resonance imaging apparatus takes a coronal image 81 of the abdomen by executing a navigator sequence (respiration monitoring sequence) such as a 2D gradient echo sequence, and obtains, as a profile, an NMR signal from a one-line equivalent region 82 including the diaphragm that is set in the coronal image 81. By repeatedly collecting the profile, the diaphragmatic motion can be intermittently detected (at intervals of 150 milliseconds in general).

Furthermore, with the above method, the magnetic resonance imaging apparatus usually detects a position 84 of the diaphragmatic motion, as a relative motion amount with respect to a reference profile 83, as illustrated in FIG. 12B. Then, the magnetic resonance imaging apparatus generates a trigger signal in a phase with a small amount of diaphragmatic motion, based on the detected amount of motion, and executes an imaging sequence in response to the trigger signal. In other words, the magnetic resonance imaging apparatus executes the imaging sequence during a respiration phase with a small amount of motion only.

In addition, the magnetic resonance imaging apparatus resumes a navigator sequence 92 several hundreds of milliseconds after executing an imaging sequence 91, as illustrated in FIG. 13. Here, a vacant time is provided between the imaging sequence 91 and the navigator sequence 92 because the signal excited in the imaging sequence 91 should be prevented from affecting, as saturation effects, the image taken in the navigator sequence 92.

With the conventional method, the magnetic resonance imaging apparatus alternately executes the navigator sequence and the imaging sequence. The above explanation focuses on the respiration-synchronizing imaging, but the magnetic resonance imaging apparatus executes the same sequences and calculation process in the breath-holding imaging also.

With the above method, however, there has been a problem of a long period of time required for imaging, as explained below.

For example, as described above, the magnetic resonance imaging apparatus according to the conventional method executes the imaging sequence only in the respiration phase with little motion. Thus, with the conventional method, the imaging sequence has to be repeated in every respiration phase with little motion until all the necessary data is collected, and therefore the entire period of time for imaging becomes very long. If the period of time for one data collecting operation is extended to reduce the imaging time, the influence of the motion would become large, and artifacts would increase in an image that is taken in the imaging sequence.

In addition, the navigator sequence that cannot be resumed immediately after the imaging sequence further extends the imaging time. If the navigator sequence is resumed immediately after the imaging sequence to reduce the imaging time, a low signal region would be created in an image taken in the navigator sequence, which makes it difficult to accurately calculate the position of the diaphragm.

BRIEF DESCRIPTION OF THE DRAWINGS

FIGS. 12A, 12B, and 13 are diagrams for explaining the conventional respiration synchronizing imaging technology that adopts NMR signals.

DETAILED DESCRIPTION

The embodiments of the magnetic resonance imaging apparatus and the method of controlling the apparatus are explained in detail below with reference to the attached drawings.

In general, according to the embodiment, a magnetic resonance imaging apparatus includes a sequence execution control unit, a slice position detecting unit, a respiratory motion estimating unit, and a sequence correcting unit. The sequence execution control unit alternately executes an imaging sequence of collecting data for generating a diagnostic image and a navigator sequence of collecting data for generating a navigator image that is an image for motion detection. The slice position detecting unit, each time the sequence execution control unit executes the navigator sequence, analyzes the navigator image generated from the data collected in the navigator sequence, and thereby detects a position of a mark that indicates a slice excited by the imaging sequence that is executed prior to the navigator sequence. The respiratory motion estimating unit estimates motion of a portion due to respiration of a subject, based on the position of the mark detected by the slice position detecting unit. The sequence correcting unit corrects an imaging sequence that is to be subsequently executed, based on the motion of the portion estimated by the respiratory motion estimating unit.

Here, the magnetic resonance imaging apparatus according to the embodiments is referred to as an "MRI apparatus".

Figure 1:
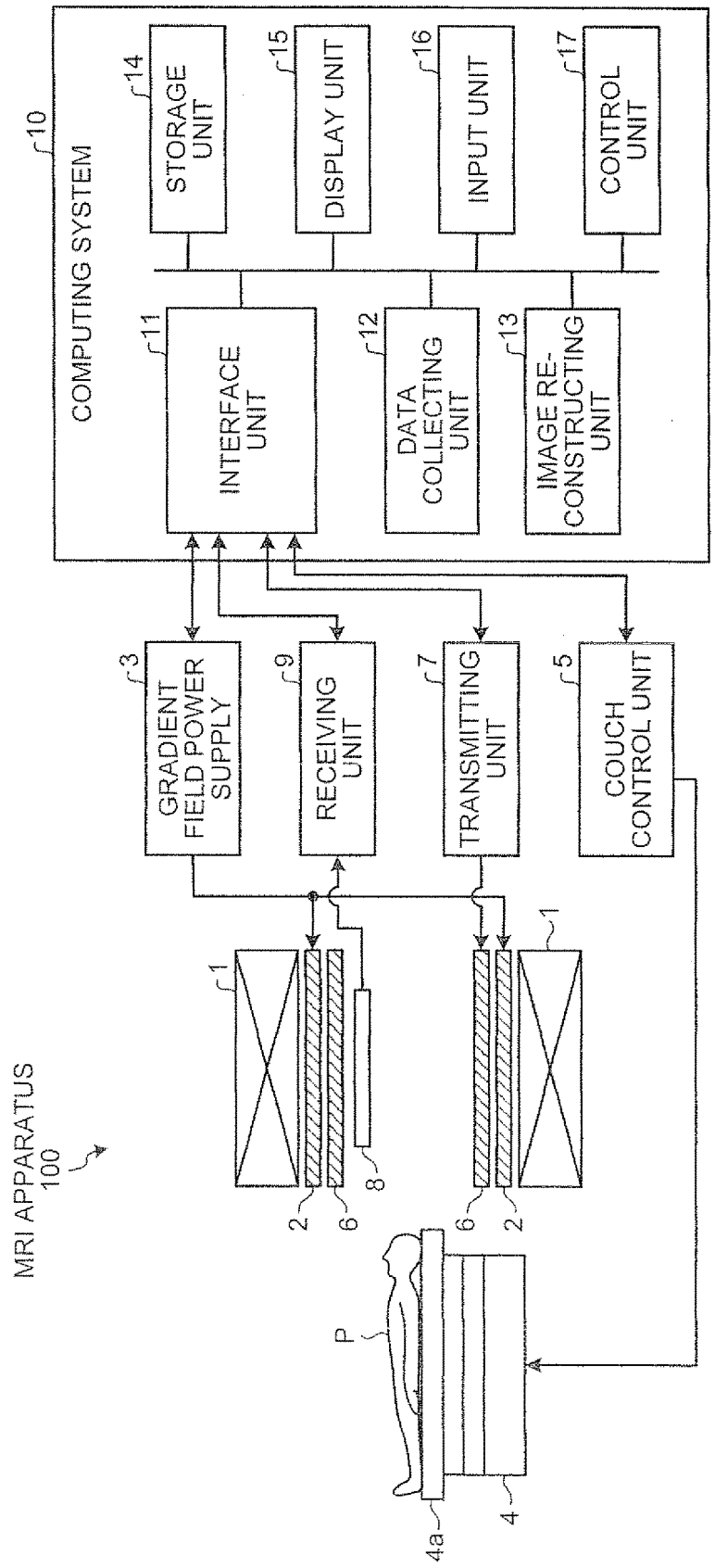
FIG. 1 is a diagram for showing the entire structure of an MRI apparatus according to the first embodiment.

First, the entire structure of the MRI apparatus according to the first embodiment is explained. FIG. 1 is a diagram of the entire structure of the MRI apparatus according to the first embodiment.

As illustrated in FIG. 1, an MRI apparatus 100 according to the first embodiment includes a magnetostatic magnet 1, a gradient coil 2, a gradient field power supply 3, a couch 4, a couch control unit 5, a transmission RF coil 6, a transmitting unit 7, a reception RF coil 8, a receiving unit 9, and a computer system 10.

The magnetostatic magnet 1 is formed in a hollow cylindrical shape to generate a magnetostatic field uniformly inside. This magnetostatic magnet 1 is prepared with, for example, a permanent magnet or a superconducting magnet.

The gradient coil 2 is formed in a hollow cylindrical shape and arranged inside the magnetostatic magnet 1. This gradient coil 2 is formed by combining three coils corresponding to the X, Y, and Z axes that are orthogonal to one another. The three coils individually receive current supply from the gradient field power supply 3 that is described later so that gradient fields whose intensities along the X, Y, and Z axes differ are generated. The Z axis is the same direction as the magnetostatic field.

The gradient fields generated by the gradient coil 2 along the X, Y, and Z axes correspond to, for example, a slice selection gradient field Gs, a phase encoding gradient field Ge, and a readout gradient field Gr, respectively. The slice selection gradient field Gs is used to determine an imaging cross section. The phase encoding gradient field Ge is used to change the phase of an NMR signal in correspondence with a spatial position. The readout gradient field Gr is used to change the frequency of the NMR signal in correspondence with the spatial position.

The gradient field power supply 3 supplies a current to the gradient coil 2 under control of the computer system 10 that is described later.

The couch 4 includes a couchtop 4a on which a subject P is laid, and carries the subject into and out of the imaging area inside the gradient coil 2 by moving the couchtop 4a in the vertical and longitudinal directions under the control of the couch control unit 5 that is explained later. The couch 4 is usually placed in such a manner that its longitudinal direction is parallel to the central axis of the magnetostatic magnet 1.

The couch control unit 5 drives the couch 4 under control of the computer system 10 that is described later so that the couchtop 4a moves in the longitudinal and vertical directions.

The transmission RF coil 6 is arranged inside the gradient coil 2, receives a high frequency pulse supplied by the transmitting unit 7, and generates a high-frequency magnetic field.

The transmitting unit 7 transmits to the transmission RF coil 6 a high-frequency pulse corresponding to the Larmor frequency, under control of the computer system 10 that is described later.

The reception RF coil 8 is arranged inside the gradient coil 2, and receives an NMR signal emitted from the subject under the influence of the high-frequency magnetic field generated by the transmission RF coil 6. Then, the reception RF coil 8 outputs the received NMR signal to the receiving unit 9 that is described later.

The receiving unit 9 generates NMR signal data based on the NMR signal output by the reception RF coil 8, under control of the computer system 10 that is described later. Then, the receiving unit 9 transmits the generated NMR signal data to the computer system. 10.

The computer system 10 controls the entire MRI apparatus 100, collects data, and reconstructs images. The computer system 10 includes an interface unit 11, a data collecting unit 12, an image reconstructing unit 13, a storage unit 14, a display unit 15, an input unit 16, and a control unit 17.

The interface unit 11 is connected to the gradient field power supply 3, the couch control unit 5, the transmitting unit 7, and the receiving unit 9 to control the input/output of signals that are exchanged between these connected units and the computer system 10.

The data collecting unit 12 collects the NMR signal data transmitted by the receiving unit 9 by way of the interface unit 11. Then, the data collecting unit 12 stores the collected NMR signal data in the storage unit 14.

The image reconstructing unit 13 performs a reconstructing process such as the Fourier transform onto the NMR signal data stored in the storage unit 14 to generate an image of the internal body of the subject P. Then, the image reconstructing unit 13 stores the generated image into the storage unit 14.

The storage unit 14 stores therein the NMR signal data collected by the data collecting unit 12, images generated by the image reconstructing unit 13, and the like for each subject P. The storage unit 14 may be a hard disk drive or a DVD drive.

The display unit 15 displays the images stored in the storage unit 14 and various types of information such as a graphical user interface (GUI) for receiving imaging conditions from the operator, under the control of the control unit 17. The display unit 15 may be a cathode ray tube (CRT) monitor or a liquid crystal monitor.

The input unit 16 receives various types of information such as the imaging conditions and various operations input by the operator. The input unit 16 may be a mouse, a keyboard, a trackball, or a pointing device.

The control unit 17 includes a central processing unit (CPU), a memory, and the like that are not shown, and controls the overall MRI apparatus 100. For example, the control unit 17 generates various pulse sequences based on the imaging conditions that are received from the operator, controls the gradient field power supply 3, the transmitting unit 7, and the receiving unit 9 in the generated pulse sequences, and thereby execute various types of imaging.

A pulse sequence here means information that determines the procedure of executing imaging such as the intensity and timing of the power supplied by the gradient field power supply 3 to the gradient coil 2, the intensity and timing of an RF signal transmitted by the transmitting unit 7 to the transmission RF coil 6, and the timing of an NMR signal detected by the receiving unit 9.

The entire structure of the MRI apparatus 100 according to the first embodiment has been explained. In such a structure of the MRI apparatus 100 according to the first embodiment, the computer system 10 alternately executes an imaging sequence to collect data for generating a diagnostic image and a navigator sequence to collect data for generating a navigator image that is an image for detecting motion.

Then, each time the navigator sequence is executed, the computer system 10 analyzes the navigator image generated from the data collected in the navigator sequence, and thereby detects the position of a mark indicating a slice excited by an imaging sequence that has been executed before this navigator sequence. Moreover, the computer system 10 estimates the motion of a portion of the subject's body in the respiration, based on the detected position of the mark, and corrects an imaging sequence that is to be subsequently executed, based on the estimated motion of the portion.

The explanation of the first embodiment focuses on saturation bands detected as marks indicating the slices excited by the imaging sequence. A "saturation band" here means a low signal region (a region with a low signal intensity) created on the navigator image because of the excitation of a slice by the imaging sequence. The saturation band is caused by the saturation effects due to the excitation of the slice.

Figure 2:
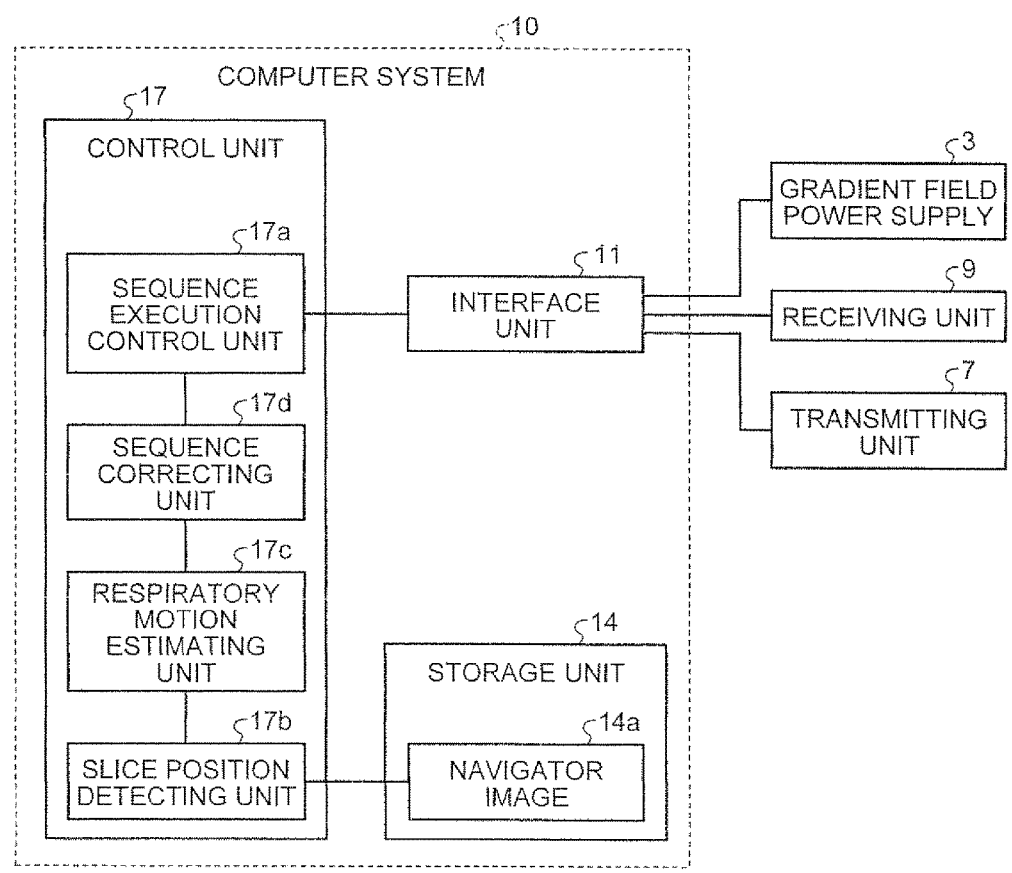
FIG. 2 is a functional block diagram for showing the detailed structure of a computer system according to the first embodiment.

Next, the computer system 10 according to the first embodiment is explained in detail. FIG. 2 is a functional block diagram for showing the structure of the computer system 10 according to the first embodiment in detail.

As illustrated in FIG. 2, in the computer system 10, the control unit 17 includes a sequence execution control unit 17*a*, a slice position detecting unit 17*b*, a respiratory motion estimating unit 17*c*, and a sequence correcting unit 17*d*.

Figure 3:
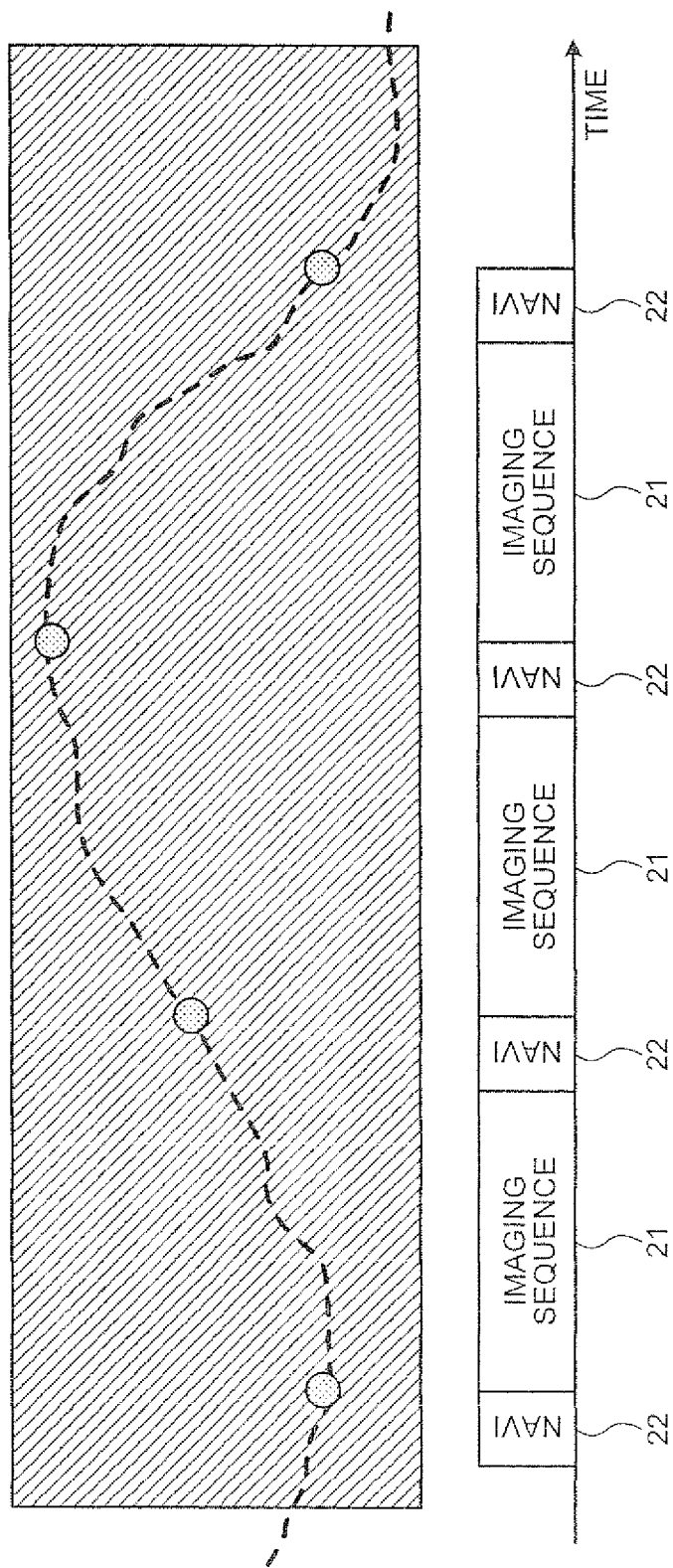
FIG. 3 is a diagram for showing an execution schedule of a sequence executed by a sequence execution control unit according to the first embodiment.

The sequence execution control unit 17*a* alternately executes the imaging sequence of collecting data for generating a diagnostic image and the navigator sequence of collecting data for generating a navigator image that is an image for motion detection. FIG. 3 is a diagram for showing a schedule of sequences executed by the sequence execution control unit 17*a*.

Specifically, the sequence execution control unit 17*a* generates a pulse sequence for an imaging sequence 21 and a pulse sequence for a navigator sequence 22, based on the imaging conditions set by the operator. Then, the sequence execution control unit 17*a* stores the generated pulse sequences in its internal memory or the like.

Thereafter, the sequence execution control unit 17*a* controls the gradient field power supply 3, the transmitting unit 7, and the receiving unit 9, based on the generated pulse sequences so that the imaging sequence 21 and the navigator sequence 22 are alternately executed, as illustrated in FIG. 3. In this drawing, the broken line schematically indicates the level of the subject's respiration. The circles on the broken line indicate timings of acquiring respiration information by processing the NMR signals collected in the navigator sequence 22.

Figure 4:
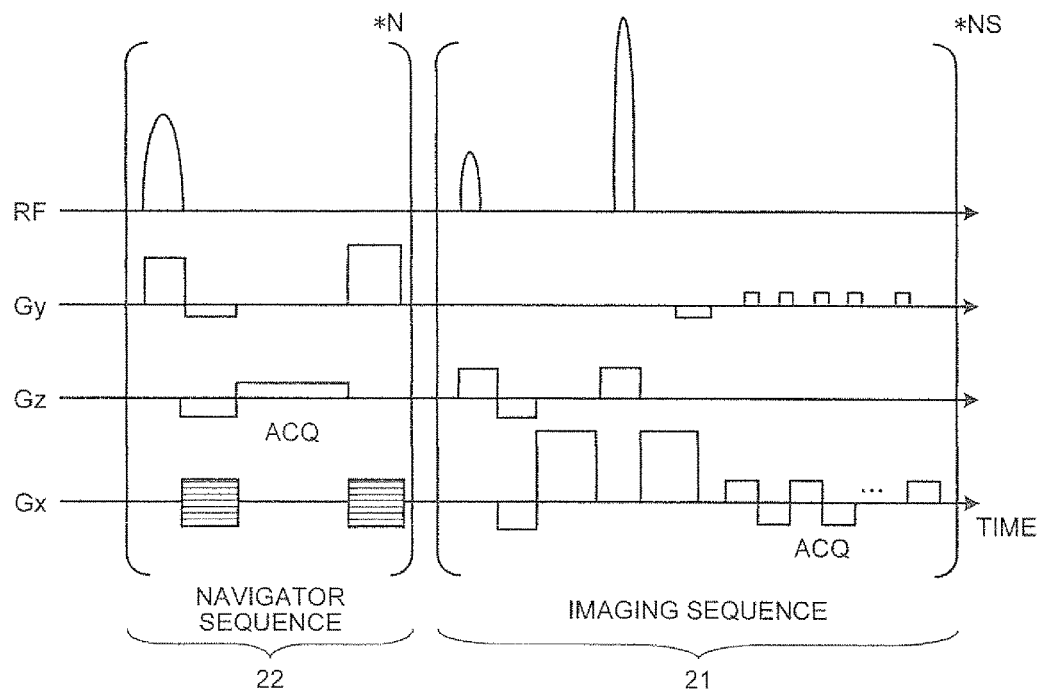
FIG. 4 is a diagram for showing examples of an imaging sequence and a navigator sequence according to the first embodiment.

Here, specific pulse sequences are adopted for the imaging sequence 21 and the navigator sequence 22. FIG. 4 is a diagram for showing examples of the imaging sequence 21 and the navigator sequence 22 according to the first embodiment. In this drawing, RF denotes a high-frequency pulse supplied to the transmission RF coil 6. Further, Gy, Gz, and Gx denote gradient field pulses supplied to the gradient coil 2. Gy corresponds to the gradient field in the Y-axis direction, Gz corresponds to the gradient field in the Z-axis direction, and Gx corresponds to the gradient field in the X-axis direction.

As illustrated in FIG. 4, for example, a pulse sequence of the 2D multi-slice echo planar imaging (EPI) for diffusion-weighted images may be used as the imaging sequence 21. The example of this drawing adopts a pulse sequence of the 2D multi-slice EPI, but any pulse sequence may be used as the imaging sequence 21. For example, a pulse sequence of a different imaging method such as fast spin echo (FSE) may be adopted, or a pulse sequence of a 3D method may be adopted in place of a pulse sequence for a 2D method.

In addition, as illustrated in FIG. 4, a pulse sequence of the 2D gradient echo may be used as the navigator sequence 22. In the example of this drawing, the navigator sequence 22 is executed on a coronal section, but it may be executed on any section. More preferably, the navigator sequence 22 should be executed on a section orthogonal to the one on which the imaging sequence 21 is executed. For example, if the imaging sequence 21 is executed on an axial section, the navigator sequence 22 should be executed on a coronal image or a sagittal image.

Figure 5:
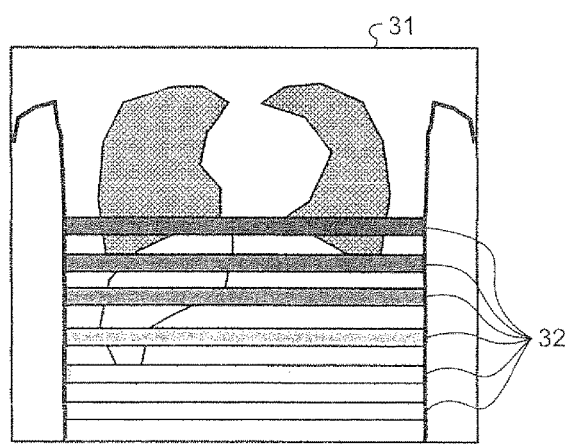
FIG. 5 is a diagram for showing an example navigator image created from data collected in the navigator sequence according to the first embodiment.

Then, in the computer system 10, each time the sequence execution control unit 17*a* executes the navigator sequence 22, the image reconstructing unit 13 generates a navigator image. FIG. 5 is a diagram for showing an example navigator image generated from the data collected in the navigator sequence 22. In this drawing, a 2D image generated when the navigator sequence 22 and the imaging sequence 21 of FIG. 2 are executed is schematically illustrated.

As shown in FIG. 5, if, for example, a poise sequence of the 2D multi-slice method is executed as the imaging sequence 21, multiple saturation bands 32 appear in stripes on a navigator image 31. Each saturation band 32 corresponds to a slice that is excited in the imaging sequence 21. The saturation level of the saturation band 32 depends on longitudinal relaxation or the like for each slice. Furthermore, the saturation level and position of the saturation band 32 vary according to the imaging conditions of the imaging sequence 21 (e.g., the thickness of a slice, a gap between slices, the excitation order of the slices, and the direction of the slices).

In FIG. 2, the slice position detecting unit 17b analyses the navigator image generated from the data collected in the navigator sequence each time the navigator sequence is executed so that the positions of the saturation bands generated by the excitation of the slice in the imaging sequence that has been executed before the navigator sequence can be detected. Any method can be adopted for the detection of the positions of the saturation bands on the navigator image.

Figure 6:
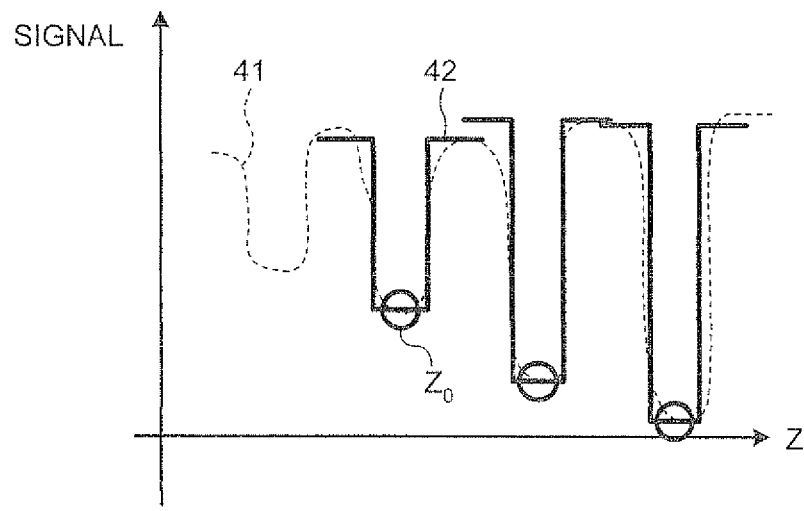
FIG. 6 is a diagram for explaining the method of detecting saturation bands by model fitting according to the first embodiment.

For example, in the execution of the navigator sequence, the slice position detecting unit 17b reads a navigator image 14a from the storage unit 14, and performs model fitting onto a profile (signal distribution) of a specific direction of the read-out navigator image 14a to detect the positions of saturation bands. FIG. 6 is a diagram for explaining the method of detecting saturation bands by model fitting.

In FIG. 6, a broken line 41 shows part of the profile in the craniocaudal (Z-axis) direction of the navigator image 31 shown in FIG. 5. The low signal portions in the Z-direction profile correspond to the saturation bands 32. In other words, four saturation bands are included in the example of FIG. 6.

As indicated in FIG. 6, the slice position detecting unit 17b fits a well-type model to the profile, and thereby determines a model saturation band 42 for the saturation bands. Then, the slice position detecting unit 17b detects the center location $Z_0$ of the bottom of the determined model saturation band 42 as the position of the saturation band.

Figure 7:
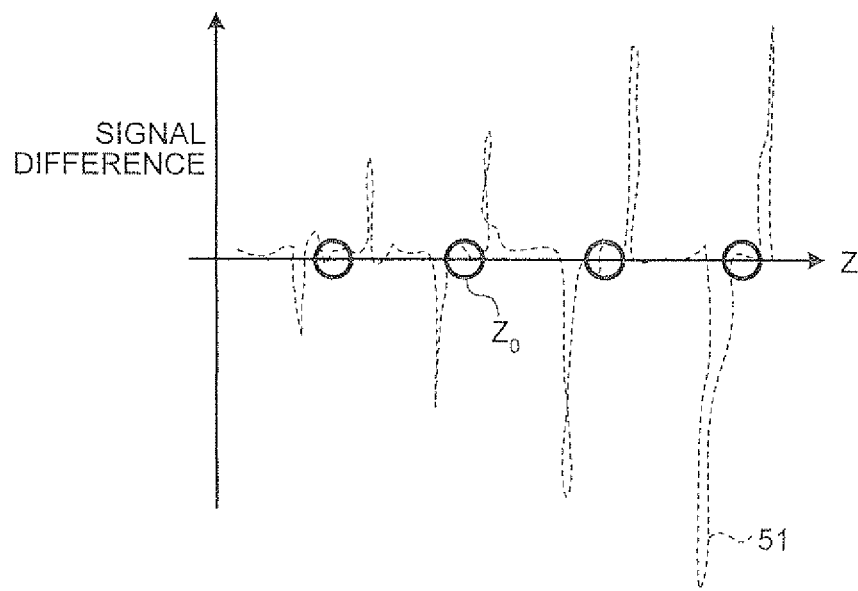
FIG. 7 is a diagram for explaining a method of detecting saturation bands by pixel difference processing according to the first embodiment.

In addition, in the execution of the navigator sequence, the slice position detecting unit 17b may detect the position of the saturation band by reading the navigator image 14a from the storage unit 14 and performing pixel difference processing onto the pixels aligned in a specific direction of the read-out navigator image 14a. The "pixel difference processing" here means a process of calculating the change rate of the signal values of pixels aligned in a specific direction by differentiation on the signal values. FIG. 7 is a diagram for explaining the method of detecting saturation bands by pixel difference processing.

In FIG. 7, a broken line 51 indicates part of a differential profile obtained by performing the pixel difference processing onto pixels aligned in the craniocaudal (Z-axis) direction of the navigator image 31 shown in FIG. 5. In the Z-direction differential profile, each segment in which a negative peak turns to a positive peak corresponds to a saturation band 32.

As illustrated in FIG. 7, the slice position detecting unit 17b may perform the pixel difference processing on the pixels aligned in the Z direction of the navigator image 31, and find segments in which a negative peak turns to a positive peak in the differential profile obtained by the pixel difference processing. Then, the slice position detecting unit 17b detects the center location $Z_0$ of the segment as the position of the saturation band. In the navigator image, the target direction of the pixel difference processing is preferably a direction along the section of a diagnostic image obtained in the imaging sequence.

Figure 8:
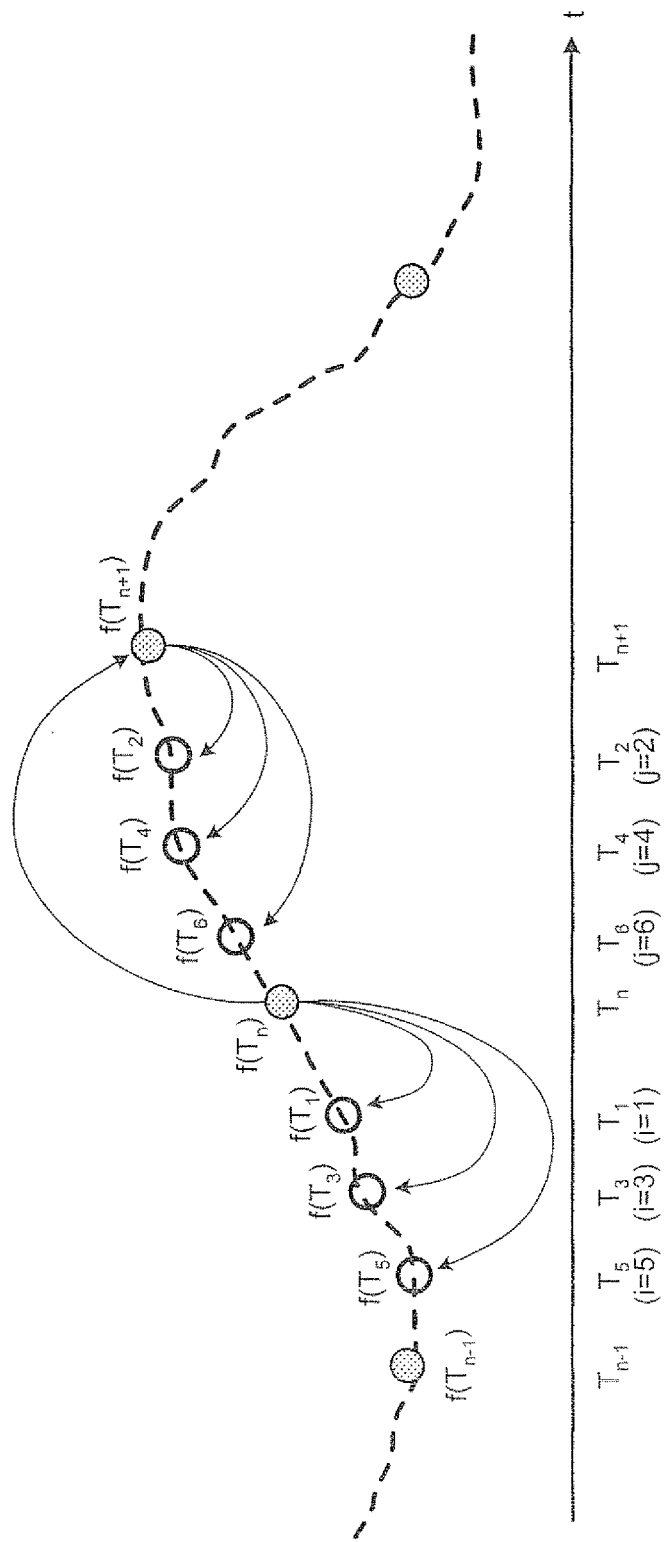
FIG. 8 is a diagram for explaining the respiratory motion estimated by a motion estimating unit according to the first embodiment.

In FIG. 2, the respiratory motion estimating unit 17c estimates the motion of the portion due to the subject's respiration, based on the positions of the saturation bands detected by the slice position detecting unit 17b. Hereinafter, the motion of the portion due to the subject's respiration is referred to as "respiratory motion". FIG. 8 is a diagram for explaining the respiratory motion estimated by the respiratory motion estimating unit 17c.

As described above, the position of a saturation band that appears in the navigator image corresponds to the position of a slice excited by the imaging sequence that has been executed before the navigator sequence. Furthermore, the position of the saturation band changes in the imaging conditions of the imaging sequence (e.g., thickness of a slice, a gap between slices, the slice excitation order, and the direction of slices).

The respiratory motion estimating unit 17c therefore estimates the respiratory motion, based on the positions of the saturation bands detected by the slice position detecting unit 17b and the imaging conditions, as explained below. The respiratory motion estimating method conducted by the respiratory motion estimating unit 17c is now explained in detail.

First, according to the first embodiment, the respiratory motion is expressed by Equation (1):

$$Z' = Z + f(t) \quad (1)$$

Here, Z is an average position of any portion inside the subject's body (hereinafter, "average position"). The average position Z is denoted by the coordinates of the apparatus, and Z=0 is the origin determined by the apparatus. Furthermore, Z' is a position of the portion at the time t. In addition, f( ) is a function broadly having a periodicity, and represents the respiratory motion.

It is assumed, for example, that the n-th navigator image is obtained at the time $t=T_n$, and that the position of the i-th one of the saturation bands detected on the n-th navigator image is expressed as $Z_{n,i}$.

If the i-th saturation band generated as a result of the excitation of the slice in the imaging sequence at the time $t=T_i$ ($<T_n$) corresponds to the portion at the average position $Z_i$, the position of the slice excited by the imaging sequence can be uniquely determined by a position $Z_{ex,i}$ that is determined by the imaging conditions and the pulse sequence scheduling.

Thus, the relationship of the above variables is expressed by Equations (2) and (3):

$$Z_i + f(T_i) = Z_{ex,i} \quad (2)$$

$$Z_i + f(T_n) = Z_{n,i} \quad (3)$$

Further, Equation (4) is obtained from Equations (2) and (3):

$$f(T_i) - f(T_n) = Z_{ex,i} - Z_{n,i} \quad (4)$$

Because the right side of Equation (4) is a variable that has already been determined, $f(T_i) - f(T_n)$ on the left side can be obtained. In the 2D multi-slice imaging, there is more than one value for i. Thus, when the number of detectable saturation bands is NS, f(t) can be calculated individually for the time $t=T_i$ (i=1, ... NS).

The respiratory motion estimating unit 17c substitutes the position $Z_{n,i}$ of the saturation band detected by the slice position detecting unit 17b and the position obtained from the imaging conditions into Equation (4), and thereby finds $f(T_i)-f(T_n)$ individually for time $t=T_i$. In this manner, the respiratory motion estimating unit 17c obtains $f(T_i)$ as a value relative to $f(T_n)$. For example, as indicated in FIG. 8, the respiratory motion estimating unit 17c obtains $f(T_1)$, $f(T_3)$, and $f(T_5)$ as values relative to $f(T_n)$.

In addition, if the i-th saturation band is detected in the (n+1)-th navigator image also, Equation (5) can be obtained in the same manner as Equation (4):

$$f(T_i)-f(T_{n+1})=Z_{ex,i}-Z_{n+1,i} \quad (5)$$

Because $f(T_i)-f(T_n)$ is already found out, Equation (6) can be obtained:

$$f(T_{n+1})-f(T_n)=Z_{n+1,i}-Z_{n,i} \quad (6)$$

In other words, by use of Equation (6), $f(T_i)$ can be calculated as a value relative to $f(T_n)$, as indicated in FIG. 8. Furthermore, $f(T_j)$ ($T_n<T_j<T_{n+1}$) can be estimated in a similar manner by detecting the position of the j-th saturation band in the (n+1)-th navigator image.

Thus, f(t) can be sequentially determined by setting imaging conditions in such a manner the saturation band caused by the excitation of the same slice is observable in different navigator images. Such imaging conditions can be easily set by interposing a navigator sequence in the excitation of several slices or more than a dozen slices. Although only $f(T_n)$ is not determined, if a reference navigator image is selected, the respiratory motion can be estimated as a relative value $f(t)-f(T_{n,ref})$.

The respiratory motion estimating unit 17c estimates the respiratory motion by sequentially determining f(t) from Equations (5) and (6), as explained above.

In FIG. 2, based on the respiratory motion estimated by the respiratory motion estimating unit 17c, the sequence correcting unit 17d corrects the subsequent imaging sequence. More specifically, when the respiratory motion estimating unit 17c estimates the respiratory motion, the sequence correcting unit 17d corrects the pulse sequence for the imaging sequence stored in the internal memory of the sequence execution control unit 17a, based on the estimated respiratory motion.

For example, the sequence correcting unit 17d calculates the amount of displacement that is caused by the respiratory motion, based on the average or the changing tendency of the relative values $f(T_i)-f(T_n)$ ($t=T_i$ ($<T_n$)) that represent the respiratory motion. Alternatively, the sequence correcting unit 17d may calculate the amount of displacement from the respiratory motion pattern obtained by pre-scanning.

Then, the sequence correcting unit 17d corrects the subsequent imaging sequence, based on the calculated amount of displacement. For example, if the calculated amount of displacement indicates displacement in the slice direction, the sequence correcting unit 17d corrects the imaging sequence by changing the frequency offset for selectively exciting the slices.

When the amount of displacement at the time of exciting the j-th slice is $dZ_j$, Equation (5) is modified as follows, after the correction is made to the imaging sequence:

$$f(T_j)-f(T_{n+1})=Z_{ex,j}+dZ_j-Z_{n+1,j} \quad (7)$$

In this manner, even when the sequence correcting unit 17d makes corrections to the imaging sequence, the respiratory motion can still be sequentially detected in the manner described above.

Figure 9:
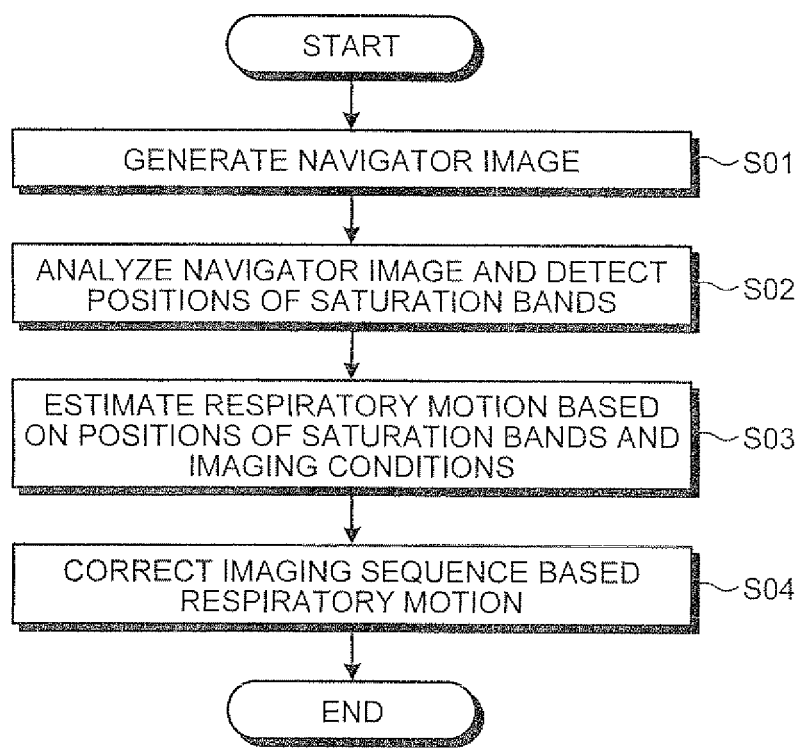
FIG. 9 is a flowchart of the processing procedure of a motion correcting method executed by the MRI apparatus according to the first embodiment.

Next, the process procedure of the motion correcting method executed by the MRI apparatus 100 according to the first embodiment is explained. FIG. 9 is a flowchart for showing the process procedure of the motion correcting method executed by the MRI apparatus 100 according to the first embodiment.

As indicated in FIG. 9, first, the image reconstructing unit 13 according to the first embodiment generates a navigator image each time the navigator sequence is executed (step S01).

Thereafter, the slice position detecting unit 17b analyzes the navigator image generated by the image reconstructing unit 13, and thereby detects the positions of the saturation bands indicating slices excited by the imaging sequence that has been executed before the navigator sequence (step S02).

Then, the respiratory motion estimating unit 17c estimates the respiratory motion, based on the positions of the saturation bands detected by the slice position detecting unit 17b (step S03).

Based on the respiratory motion estimated by the respiratory motion estimating unit 17c, the sequence correcting unit 17d corrects the subsequent imaging sequence (step S04).

According to the first embodiment, the operations of steps S01 to S04 are repeated during the process of taking images of the abdomen or the like.

As described above, according to the first embodiment, the sequence execution control unit 17a alternately executes the imaging sequence of collecting data for generating a diagnostic image and the navigator sequence of collecting data for generating a navigator image for motion detection. Each time the navigator sequence is executed, the slice position detecting unit 17b analyzes the navigator image generated from the data collected by the navigator sequence, and detects the positions of the saturation bands indicating the slices excited by the imaging sequence prior to the navigator sequence. Furthermore, the respiratory motion estimating unit 17c estimates the respiratory motion, based on the detected positions of the saturation bands. Then, the sequence correcting unit 17d corrects the imaging sequence that is to be subsequently executed, based on the estimated respiratory motion.

According to the first embodiment, the imaging sequence that can be executed only with the breath being held in the conventional technology can be executed substantially over the entire respiration cycle. In addition, no vacant time should be interposed between an imaging sequence and a navigator sequence, and therefore the sequences can be continuously executed. Thus, according to the first embodiment, artifacts that tend to appear in images due to the respiration can be reduced, and the length of the imaging time can be shortened.

In addition, according to the first embodiment, the slice position detecting unit 17b performs model fitting onto the profile of a specific direction of the navigator image, and thereby detects the positions of saturation bands.

Hence, according to the first embodiment, because saturation bands can be detected from a navigator image by simple processing, the respiratory motion can be efficiently estimated. For this reason, the length of time for estimating the respiratory motion can be shortened, which further shortens the length of imaging time.

In addition, according to the first embodiment, the slice position detecting unit 17b performs pixel difference processing onto pixels aligned in a specific direction of a navigator image and thereby detects the positions of saturation bands.

Thus, according to the first embodiment, saturation bands can be accurately detected from the navigator image, which increases the accuracy in estimation of the respiratory motion. As a result, artifacts associated with the respiratory motion can be further reduced.

According to the first embodiment, the respiratory motion is estimated based on the positions of the saturation bands, but the embodiments of the magnetic resonance imaging apparatus and the controlling method are not limited thereto. For example, the respiratory motion can be estimated based on the position of a high-signal region (i.e., a region having a high signal intensity) that is formed on the navigator image by the excitation of a dummy slice in the imaging sequence.

In the following description, the second embodiment is discussed, where respiratory motion is estimated based on a high-signal region formed by the excitation of a dummy slice. An MRI apparatus according to the second embodiment basically has the same structure as the MRI apparatus 100 of FIG. 1. However, there are differences in the type of navigator sequence and the process performed by the slice position detecting unit 17b.

Figure 10:
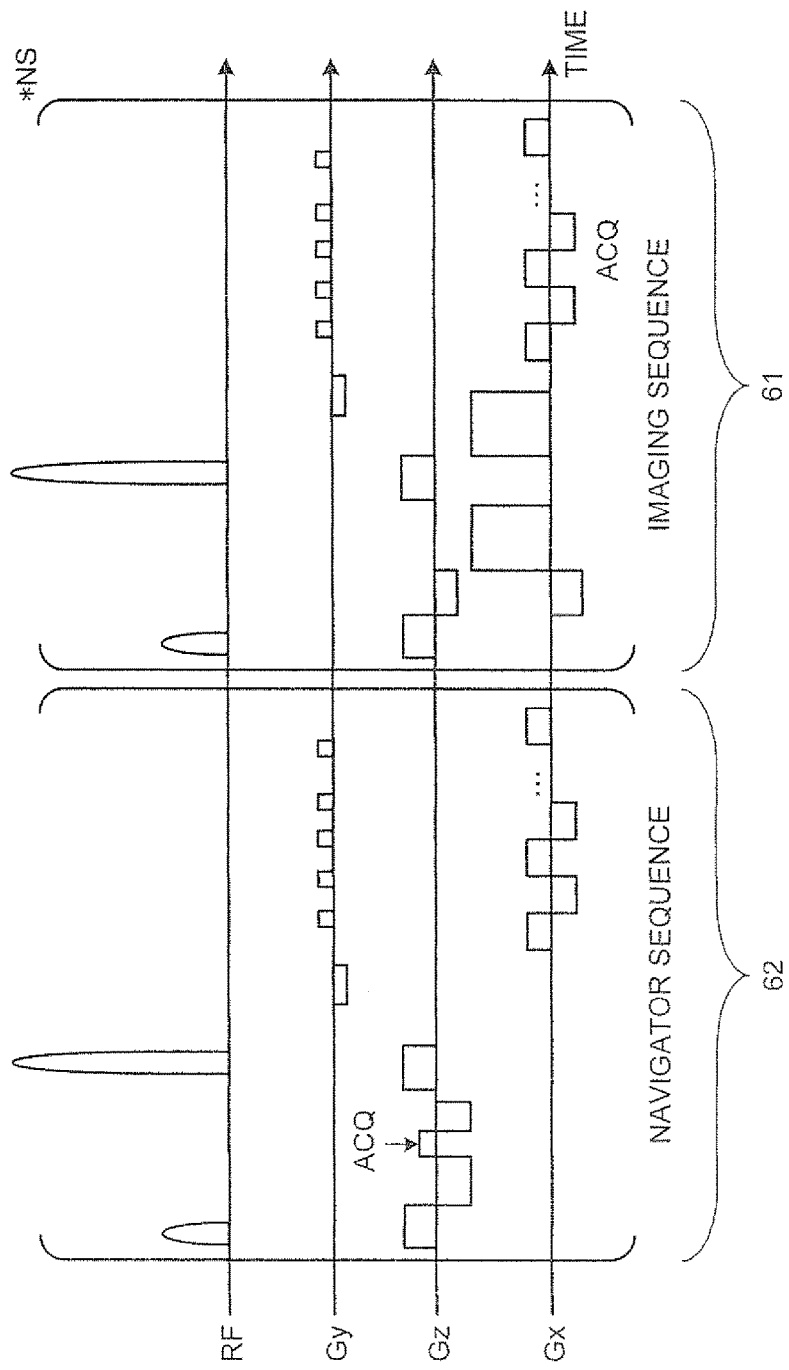
FIG. 10 is a diagram of examples of an imaging sequence and a navigator sequence according to the second embodiment.

More specifically, the sequence execution control unit 17a according to the second embodiment executes, as a navigator sequence, a pulse sequence for collecting data from a dummy slice that is set in a different position from that of a slice of a diagnostic image. FIG. 10 is a diagram for showing examples of the imaging sequence and the navigator sequence according to the second embodiment.

As illustrated in FIG. 10, the sequence execution control unit 17a according to the second embodiment executes, as a navigator sequence 62, a pulse sequence that is almost similar to an imaging sequence 61. However, the navigator sequence 62 collects NMR signal data from the dummy slice that is set in a different position from that of a diagnostic image (see "ACQ" in the navigator sequence in FIG. 10). In addition, no MPG pulse is applied in the navigator sequence 62.

Figure 11:
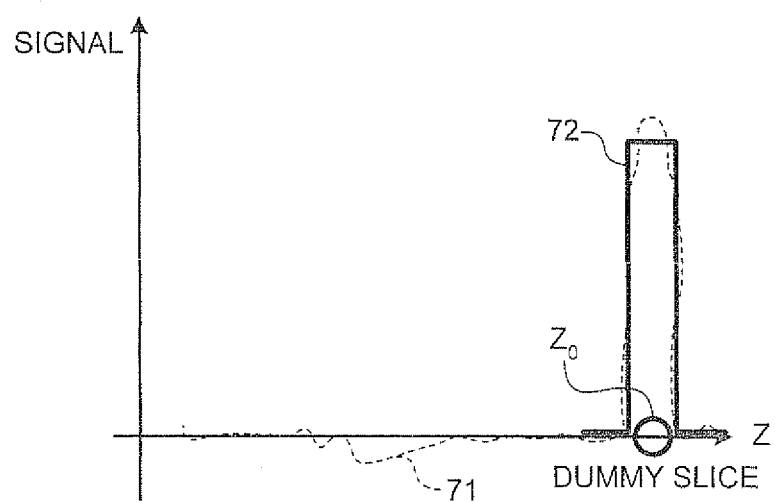
FIG. 11 is a diagram for explaining detection of a high signal region created by a dummy slice according to the second embodiment.
Figure 12A:
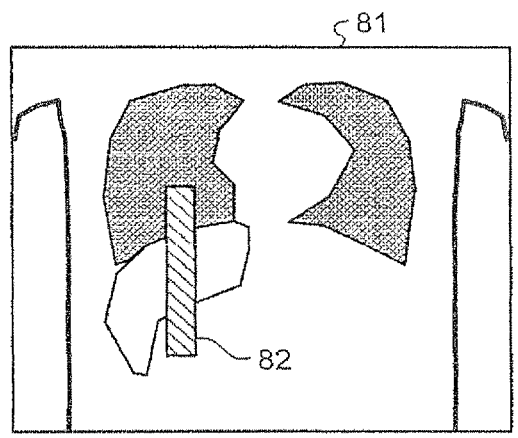
Figure 12B:
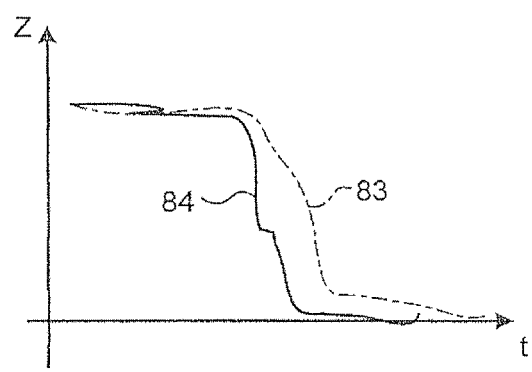

Then, the slice position detecting unit 17b according to the second embodiment detects the position of a high-signal region formed on the navigator image by excitation of the dummy slice in the imaging sequence 61. FIG. 11 is a diagram for explaining detection of the high-signal region formed by the dummy slice according to the second embodiment.

More specifically, as shown in FIG. 11, the slice position detecting unit 17b performs a fast Fourier transform (FFT) on the NMR signal data collected from the dummy slice and analyzes a Z-axis profile 71 obtained from the transform. In this profile 71, the position at which the dummy slice is excited is presented as a high-signal region.

The slice position detecting unit 17b may detect the position of the high-signal region formed by the dummy slice by performing model fitting or pixel difference processing onto the profile 71 as discussed in the first embodiment.

For example, as indicated in FIG. 11, the slice position detecting unit 17b fits a well-type model 72 that is an upside-down model of the first embodiment and thereby identifies the position of the high-signal region. Then, the slice position detecting unit 17b detects the center location $Z_0$ of the detected high-signal region on the Z axis as the position of the high-signal region.

In this manner, according to the second embodiment, the position of the high-signal region is detected by use of a dummy slice instead of detecting the positions of saturation bands, and the same effects as in the first embodiment can be achieved.

The explanation of the first and second embodiments focuses on correction of the imaging sequence based on the respiratory motion of the portion estimated by the respiratory motion estimating unit. However, the embodiments of the magnetic resonance imaging apparatus and the controlling method are not limited thereto.

For example, the data collected in the imaging sequence may be sorted and selected, based on the respiratory motion of the portion estimated by the respiratory motion estimating unit. In such a structure, for example, each time the navigator sequence is executed, the control unit determines whether the motion of the portion is stable, based on the motion of the portion estimated by the respiratory motion estimating unit. The subsequent imaging sequence may be executed again at a different time.

For example, the control unit determines that the motion of a portion is stable when the estimated amount of motion of the portion exceeds a certain threshold value. In addition, the control unit determines that the motion of the portion is not stable when the estimated amount of motion of the portion is smaller than or equal to the certain threshold value. Alternatively, the control unit may be configured to determine that the motion of the portion is stable when the estimated amount of motion of the portion is within a certain range, and that the motion of the portion is not stable when the estimated amount of motion of the portion is out of the range.

Then, when determining that the motion of the portion is stable, the control unit performs control so that the data collected the subsequent imaging sequence is used as image reconstruction data. On the other hand, when the estimated amount of motion of the portion is equal to or smaller than the threshold value, the control unit performs control so that the data collected in the subsequent imaging sequence is not used as image reconstruction data.

Alternatively, the imaging sequence may be corrected, based on the respiratory motion of the portion estimated by the respiratory motion estimating unit, by the method explained in the first and second embodiments, and then the data collected in the corrected imaging sequence may be subjected to sorting and selecting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging (MRI) apparatus, comprising:
   a sequence execution control unit configured to repeatedly and alternately execute MRI data acquisition sequences for (a) a diagnostic image and (b) a navigator image from a subject being imaged, the navigator image being an image used for motion detection;
   a slice position detecting unit configured to analyze each subsequent navigator image and thereby detect a position of a mark that indicates a position of a slice excited by the prior execution of a diagnostic imaging sequence;
   a respiratory motion estimating unit configured to estimate motion of a portion of the subject due to respiration, based on the position of the mark; and a sequence correcting unit configured to correct a diagnostic imaging sequence to be subsequently executed, based on the estimated respiratory motion.

2. The magnetic resonance imaging apparatus according to claim 1, wherein the slice position detecting unit detects, as the position of the mark, a low-signal region formed on the navigator image by excitation of the slice in the prior diagnostic imaging sequence.

3. The magnetic resonance imaging apparatus according to claim 2, wherein the slice position detecting unit performs model fitting onto a profile of the navigator image in a predetermined direction, and thereby detects the position of the mark.

4. The magnetic resonance imaging apparatus according to claim 2, wherein the slice position detecting unit performs pixel difference processing on pixels aligned in a predetermined direction on the navigator image, and thereby detects the position of the mark.

5. The magnetic resonance imaging apparatus according to claim 1, wherein:
the navigator sequence collects navigator image data from a dummy slice that is set in a different position from that of the slice of the diagnostic image; and
the slice position detecting unit detects, as the position of the mark, a high-signal region formed on the navigator image by excitation of the dummy slice.

6. The magnetic resonance imaging apparatus according to claim 5, wherein the slice position detecting unit performs model fitting onto a profile of the navigator image in a predetermined direction, and thereby detects the position of the mark.

7. The magnetic resonance imaging apparatus according to claim 5, wherein the slice position detecting unit performs pixel difference processing on pixels aligned in a predetermined direction on the navigator image, and thereby detects the position of the mark.

8. The magnetic resonance imaging apparatus according to claim 1, wherein the slice position detecting unit performs model fitting onto a profile of the navigator image in a predetermined direction, and thereby detects the position of the mark.

9. The magnetic resonance imaging apparatus according to claim 1, wherein the slice position detecting unit performs pixel difference processing on pixels aligned in a predetermined direction on the navigator image, and thereby detects the position of the mark.

10. A magnetic resonance imaging (MRI) apparatus, comprising:
a sequence execution control unit configured to repeatedly and alternately execute MRI data acquisition sequences for (a) a diagnostic image and (b) a navigator image from a subject being imaged, the navigator image being an image used for motion detection;
a slice position detecting unit configured to analyze each subsequent navigator image and thereby detect a position of a mark that indicates a position of a slice excited by the prior execution of a diagnostic imaging sequence; and
a respiratory motion estimating unit configured to estimates motion of a portion of the subject due to respiration, based on the position of the mark.

11. A method of controlling a magnetic resonance imaging (MRI) apparatus, said method comprising:
controlling a sequence execution control unit to repeatedly and alternately execute MRI data acquisition sequences for (a) a diagnostic image and (b) a navigator image from a subject being imaged, the navigator image being an image used for motion detection;
controlling a slice position detecting unit to analyze each subsequent navigator image and thereby detect a position of a mark that indicates a position of a slice excited by the prior execution of a diagnostic imaging sequence; and
controlling a respiratory motion estimating unit to estimate motion of a portion of the subject due to respiration based on the position of the mark.

* * * * *